(12) United States Patent
Bao et al.

(10) Patent No.: US 12,451,332 B2
(45) Date of Patent: Oct. 21, 2025

(54) ATOMIC LAYER TREATMENT PROCESS USING METASTABLE ACTIVATED RADICAL SPECIES

(71) Applicant: LAM RESEARCH CORPORATION, Fremont, CA (US)

(72) Inventors: Xinyu Bao, Fremont, CA (US); Haoquan Fang, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 681 days.

(21) Appl. No.: 17/274,350

(22) PCT Filed: Aug. 30, 2019

(86) PCT No.: PCT/US2019/049079
§ 371 (c)(1),
(2) Date: Mar. 8, 2021

(87) PCT Pub. No.: WO2020/055612
PCT Pub. Date: Mar. 19, 2020

(65) Prior Publication Data
US 2022/0093365 A1 Mar. 24, 2022

Related U.S. Application Data

(60) Provisional application No. 62/729,124, filed on Sep. 10, 2018.

(51) Int. Cl.
*H01J 37/32* (2006.01)
*C23C 16/455* (2006.01)
(Continued)

(52) U.S. Cl.
CPC .. *H01J 37/32449* (2013.01); *C23C 16/45544* (2013.01); *C23C 16/45565* (2013.01);
(Continued)

(58) Field of Classification Search
None
See application file for complete search history.

(56) References Cited

U.S. PATENT DOCUMENTS

| 9,601,319 B1 | 3/2017 | Bravo et al. |
| 2003/0183171 A1 | 10/2003 | Sneh et al. |

(Continued)

FOREIGN PATENT DOCUMENTS

| CN | 103748658 A | 4/2014 |
| CN | 106952799 A | 7/2017 |

(Continued)

OTHER PUBLICATIONS

International Search Report and Written Opinion of the ISA issued in PCT/US2019/049079, mailed Dec. 18, 2019; ISA/KR.
(Continued)

*Primary Examiner* — Parviz Hassanzadeh
*Assistant Examiner* — Laureen Chan

(57) ABSTRACT

A method for treating an exposed surface of a substrate includes purging first and second chambers of a substrate processing system using a purge gas. A gas distribution device is arranged between the first chamber and the second chamber. The method includes flowing a treatment gas to the second chamber but not the first chamber to create an adsorption layer on a surface of a substrate arranged on a substrate support in the second chamber. The method includes stopping flow of the treatment gas to the second chamber. The method includes flowing the purge gas to purge the first chamber and the second chamber. The method includes, while flowing the purge gas to the first chamber, striking plasma in the first chamber to create metastable active radical species and delivering the metastable active radical species through the gas distribution device to the second chamber to surface activate the adsorption layer.

9 Claims, 5 Drawing Sheets

(51) Int. Cl.
    *H01L 21/02*         (2006.01)
    *H01L 21/3065*     (2006.01)

(52) U.S. Cl.
    CPC .... *H01J 37/32724* (2013.01); *H01L 21/0228* (2013.01); *H01L 21/02326* (2013.01); *H01L 21/0234* (2013.01); *H01L 21/3065* (2013.01); *H01J 2237/334* (2013.01)

(56) References Cited

U.S. PATENT DOCUMENTS

| | | | |
|---|---|---|---|
| 2013/0023125 A1* | 1/2013 | Singh | H01J 37/3244 |
| | | | 257/E21.49 |
| 2013/0082197 A1* | 4/2013 | Yang | H01J 37/32091 |
| | | | 250/505.1 |
| 2014/0097270 A1* | 4/2014 | Liang | C23C 16/452 |
| | | | 239/548 |
| 2014/0179114 A1* | 6/2014 | van Schravendijk | |
| | | | C23C 16/45544 |
| | | | 438/758 |
| 2014/0235069 A1* | 8/2014 | Breiling | H01J 37/321 |
| | | | 239/548 |
| 2016/0329221 A1 | 11/2016 | Berry, III et al. | |
| 2017/0229325 A1 | 8/2017 | Lubomirsky et al. | |
| 2018/0163305 A1* | 6/2018 | Batzer | H01J 37/32082 |
| 2018/0174870 A1 | 6/2018 | Yang et al. | |
| 2018/0204716 A1* | 7/2018 | Takahashi | C23C 16/45534 |
| 2018/0247832 A1* | 8/2018 | Fischer | H01L 21/326 |

FOREIGN PATENT DOCUMENTS

| | | |
|---|---|---|
| JP | 2017157660 A | 9/2017 |
| JP | 2018117038 A | 7/2018 |
| TW | 201413044 A | 4/2014 |
| TW | 201442071 A | 11/2014 |
| TW | 201635383 A | 10/2016 |
| TW | 201324613 A | 6/2023 |
| TW | 201348502 A | 12/2023 |

OTHER PUBLICATIONS

Japanese Office Action for Japanese Application No. 2021-513199 dated Sep. 26, 2023.
Taiwanese Office Action and Search Report for Taiwanese Application No. 108132419 dated Nov. 14, 2023.
Taiwanese Office Action and Search Report for Taiwanese Application No. 108132419 dated May 15, 2023.
Chinese Office Action and Search Report for Chinese Application No. 201980059258 dated Apr. 18, 2024.

* cited by examiner

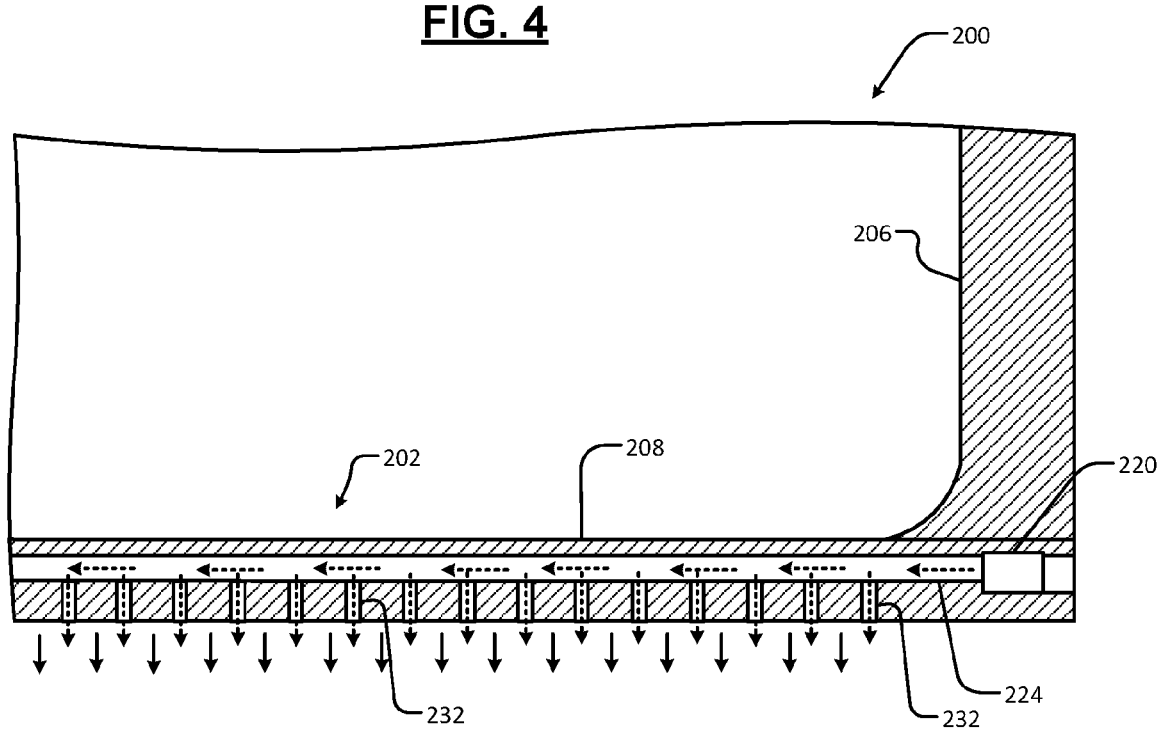
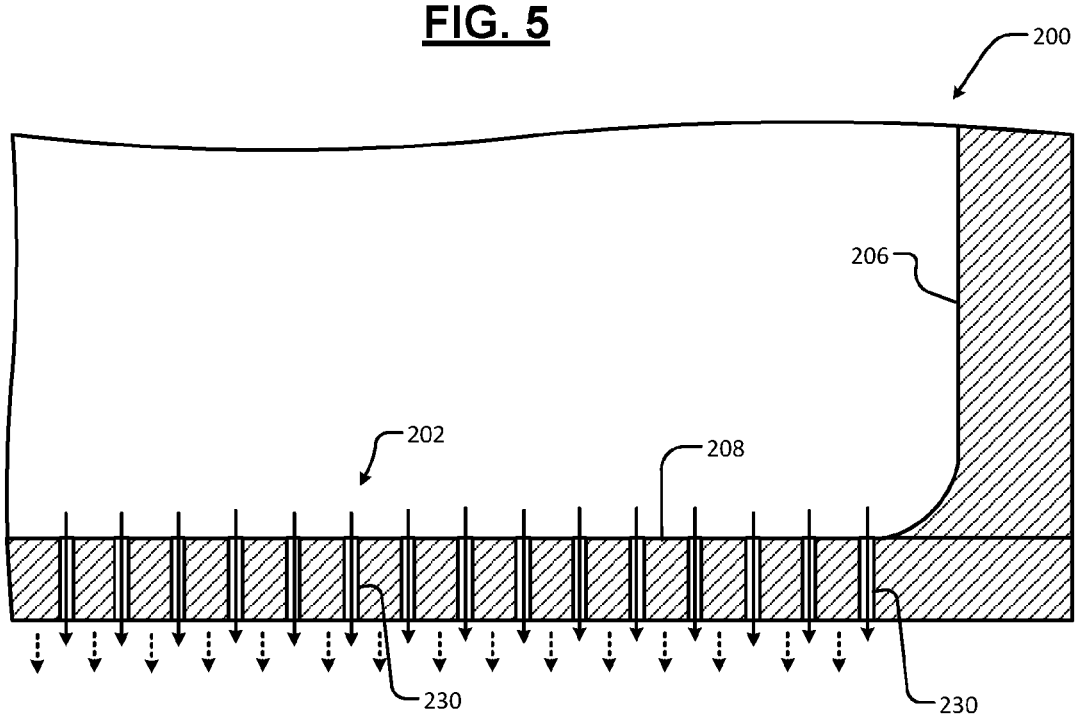

ATOMIC LAYER TREATMENT PROCESS USING METASTABLE ACTIVATED RADICAL SPECIES

CROSS-REFERENCE TO RELATED APPLICATIONS

This application is a U.S. National Phase Application under 35 U.S.C. 371 of International Application No. PCT/US2019/049079, filed on Aug. 30, 2019 which claims the benefit of U.S. Provisional Application No. 62/729,124, filed on Sep. 10, 2018. The entire disclosures of the applications referenced above are incorporated herein by reference.

FIELD

The present disclosure relates to substrate processing systems, and more particularly to substrate processing systems for performing a treatment process using metastable activated radical species.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. The substrate processing system typically includes a processing chamber, a substrate support (such as an electrostatic chuck) and a gas delivery system. Examples of substrate treatments include etching, deposition, photoresist removal, cleaning, etc. During processing, the substrate is arranged on the substrate support and one or more process gases may be introduced by the gas delivery system into the processing chamber. RF power may be supplied to strike plasma that initiates chemical reactions. An RF bias may be supplied to the substrate support to control ion energy.

Features are defined on the substrates using deposition, etching and other treatments. As technology continues to progress, the feature sizes continue to decrease. It is important to have very precise process control in order to reliably fabricate substrates having small features. Currently, feature sizes are less than 10 nm and are pushing to 5 nm and beyond.

During some oxidation processes, there is no etch stop. Conventional methods for performing oxidation rely on oxide formed on the substrate during the oxidation process as a diffusion barrier layer to reduce or stop further oxidation of the substrate. These approaches experience large variations in oxidation thickness depending on properties and surface conditions of the material that is used. For example, a smooth surface will have less oxidation as compared to a rough surface even though the same material is used. Likewise, a porous surface will experience faster oxidation and have less effectiveness when blocking diffusion as compared to a less porous material.

SUMMARY

A method for treating an exposed surface of a substrate includes a) purging a first chamber and a second chamber of a substrate processing system using a purge gas, wherein a gas distribution device is arranged between the first chamber and the second chamber; b) after a), flowing a treatment gas to the second chamber but not the first chamber to create an adsorption layer on a surface of a substrate arranged on a substrate support in the second chamber; c) stopping flow of the treatment gas to the second chamber; d) flowing the purge gas to purge the first chamber and the second chamber; and e) while flowing the purge gas to the first chamber, striking plasma in the first chamber to create metastable active radical species and delivering the metastable active radical species through the gas distribution device to the second chamber to surface activate the adsorption layer.

In other features, the substrate is oxidized or etched with monolayer control. The method includes supplying the purge gas to the first chamber during b). The purge gas includes helium (He) and the treatment gas includes molecular oxygen ($O_2$).

In other features, the purge gas is selected from a group consisting of helium (He) and molecular nitrogen ($N_2$) and the treatment gas is selected from a group consisting of molecular oxygen ($O_2$), hydrochloric acid (HCl), molecular chlorine ($Cl_2$), nitrogen trifluoride ($NF_3$), and molecular hydrogen ($H_2$).

The method includes etching the substrate by selecting the treatment gas from a group consisting of molecular chlorine ($Cl_2$), nitrogen trifluoride ($NF_3$), and molecular hydrogen ($H_2$); and controlling a temperature of the substrate during treatment to a predetermined temperature that is less than an etch reaction temperature of the selected treatment gas.

In other features, the metastable active radical species surface activate the adsorption layer.

In other features, a) to f) are repeated one or more times. The first chamber and the second chamber are void of the treatment gas during f). A predetermined volume of the treatment gas is supplied during b).

A substrate processing system for selectively etching a substrate includes a first chamber and a second chamber including a substrate support. A gas delivery system selectively supplies at least one of a purge gas and a treatment gas to the first chamber and the second chamber. A plasma generating system selectively generates plasma in the first chamber. A gas distribution device defines a plenum and includes a first plurality of through holes from an upper surface of the gas distribution device to a lower surface of the gas distribution device and a second plurality of through holes from the plenum to the lower surface. A controller is configured to a) flow the purge gas to purge the first chamber and the second chamber; b) after a), flow the treatment gas to the plenum to create an adsorption layer on a surface of the substrate; c) stop flow of the treatment gas; d) flow the purge gas to purge the first chamber and the second chamber; and e) while flowing the purge gas to the first chamber, strike plasma in the first chamber to create metastable active radical species and to deliver the metastable active radical species to the second chamber through the gas distribution device.

In other features, the controller is configured to select helium (He) as the purge gas and molecular oxygen ($O_2$) as the treatment gas. The controller is configured to select the purge gas from a group consisting of helium (He) and molecular nitrogen ($N_2$) and the treatment gas from a group consisting of molecular oxygen ($O_2$), hydrochloric acid (HCl), molecular chlorine ($Cl_2$), nitrogen trifluoride ($NF_3$), and molecular hydrogen ($H_2$).

In other features, the controller is configured to etch the substrate by selecting the treatment gas from a group consisting of molecular chlorine ($Cl_2$), nitrogen trifluoride (NF$_3$), and molecular hydrogen (H$_2$); and controlling a temperature of the substrate during treatment to a predetermined temperature that is less than an etch reaction temperature of the selected treatment gas.

In other features, the metastable active radical species surface activate the adsorption layer. The controller is configured to repeat a) to e) one or more times. The first chamber and the second chamber are void of the treatment gas during e). The controller is configured to supply a predetermined volume of the treatment gas during b). The controller is configured to supply the purge gas to the first chamber during b).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is a first cross-sectional view of the gas distribution device including the dual gas plenum of FIG. 3 according to the present disclosure;

FIG. 5 is a second cross-sectional view of the gas distribution device including the dual gas plenum of FIG. 3 according to the present disclosure.

In the drawings, reference numbers may be reused to identify similar and/or identical elements.

DETAILED DESCRIPTION

Systems and methods according to the present disclosure relate to substrate treatments including oxidation or etching with control at a monolayer level. Oxygen plasma or oxygen downstream plasma may be used for oxidation treatment of a surface of a substrate. Direct oxygen plasma has high energy oxygen ions that can damage a surface of the substrate. Porous materials of the substrate experience increased damage. Other processes use remote or downstream plasma and attempt to filter oxygen ions. However, some ions still pass through the filter and cause damage to the substrate.

The oxygen plasma provides very reactive oxygen radicals that oxidize the surface quickly. It is very hard to control uniformity across the substrate and maintain substrate to substrate repeatability. The oxidation species are often over supplied by the oxygen plasma which leads to uncontrolled oxidation and damage to sensitive surfaces. If the surface of the substrate has several types of materials that are exposed, loading effects will be significant if the materials have different oxidation behavior due to local consumption variation limited by the species transportation speed.

Systems and methods according to the present disclosure relate to processes for oxidizing or etching the surface of the substrate at a monolayer level with precise control. The oxidation or etching is limited by adsorbed oxygen at a rate of one monolayer at a time. For example, diffusion is minimized by activating the oxygen only at a top surface of the substrate using downstream He radicals. Advantages include oxidation at a monolayer level, minimized diffusion, no ion damage, and precise oxidation control. In some examples, the process includes atomic layer treatment using molecular oxygen (O$_2$) and helium (He), although other treatments are described herein.

In other examples, the systems and methods described herein can be used to etch an exposed surface of a substrate at a monolayer level. For example, the treatment gas may include HCl and the metastable activated radical species are used to surface activate chlorine to etch a monolayer. In other examples, Cl$_2$, NF$_3$ or H$_2$ are adsorbed onto a surface of the substrate at a temperature lower than an etch reaction temperature (e.g. lower than about 300° C. for Cl$_2$ or NF$_3$ and lower than about 400° C. for H$_2$). The metastable activated radical species are used to surface activate the surface adsorbed chlorine, fluorine or hydrogen species to provide monolayer etching.

Figure 1B:
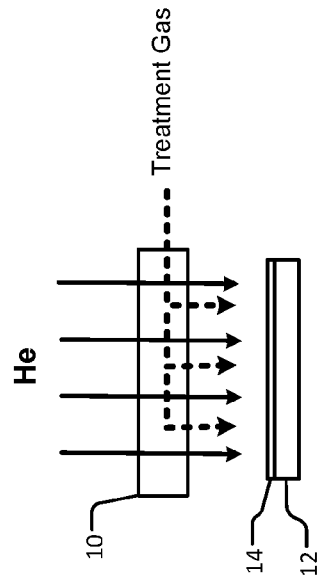
FIGS. 1A to 1D illustrate an atomic layer treatment process using metastable activated radical species to surface activate treatment species adsorbed onto a surface of a substrate according to the present disclosure.
Figure 1D:
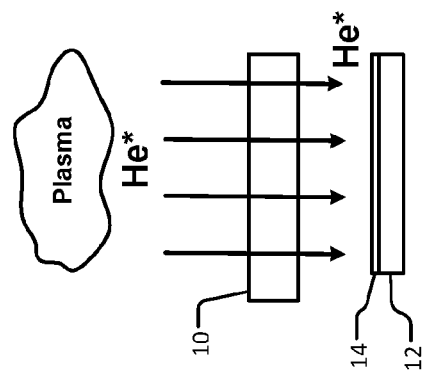
Figure 1A:
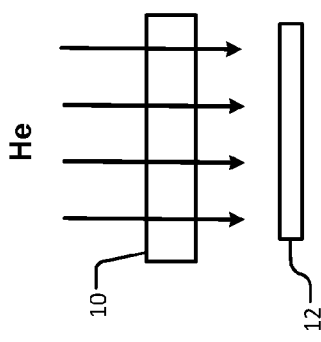

An example is shown in FIGS. 1A to 1D. In FIG. 1A, a substrate 12 is arranged on a substrate support in a processing chamber. In some examples, the substrate includes an exposed low k dielectric layer and an exposed atomic layer deposition (ALD) silicon nitride (Si$_3$N$_4$) layer. He flow is supplied through a gas distribution device 10 to purge the processing chamber. In FIG. 1B, after purging is performed, a predetermined amount of treatment gas such as O$_2$ is supplied by the gas distribution device 10. For example only, 100 to 10,000 standard cubic centimeters (sccm) of O$_2$ (e.g. 1000 sccm) is supplied for 1 to 100 seconds (e.g. 10 seconds) to allow O$_2$ saturation and O$_2$ adsorption on a surface of the substrate.

Figure 1C:
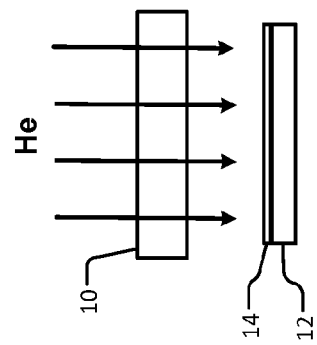

In FIG. 1C, after sufficient O$_2$ is supplied, the treatment gas (O$_2$) is turned off and the processing chamber is purged with high flow He to remove residual O$_2$ in the chamber. In some examples, 2500 to 20,000 sccm (e.g. 5000 sccm) of He is supplied for 5 seconds to 60 seconds (e.g. 10 seconds). At this point, plasma has not been struck. In FIG. 1D, plasma is turned on after He purge. He* metastable activated radical species are used to surface activate the adsorbed O$_2$ and oxidize a monolayer on the surface. The process can be repeated one or more times as needed. As can be appreciated, the low k dielectric film has negligible loss after oxidation of the ALD SiN film whereas other methods may experience loss of about 100 Angstroms of the low k dielectric film.

Advantages of the foregoing include controlled and minimized oxidization (about a monolayer) per cycle. Oxygen ion damage is eliminated since the plasma does not include oxygen (e.g. He plasma is used). Good uniformity occurs since a monolayer of oxygen is saturated on all of the substrate surfaces. The process enables precise oxidation amount control by varying the number of cycles.

Several factors differentiate the foregoing process. Oxygen is supplied at a fixed dose below the gas distribution device while purge gas flows to the first chamber (and optionally to the second chamber). This approach prevents excess oxygen back diffusion to the ICP plasma region which may create oxygen ions and cause ion damage. The oxygen is adsorbed on the surface of the substrate at a monolayer level and the rest of the oxygen in the processing chamber is purged. This approach provides uniform coverage of treatment gas such as oxygen over the surface of the substrate. The surface dose of oxygen is self-limited based on the desorption rate.

He only plasma is generated above the gas distribution device. Therefore only neutral He* radicals travel downstream and reach the surface of the substrate. The adsorbed oxygen is surface activated locally on the surface of the substrate by the He* radicals and the oxygen oxidizes an underlying surface of the substrate. The oxygen dose depends on adsorption. This process is less sensitive to loading effects due to density variations or different materials exposed at the same time.

As can be appreciated, while the foregoing example relates to oxidation treatments using He* radicals, other treatments can be performed using other treatment gases. In some examples, the purge gas may include molecular nitrogen ($N_2$) or another inert gas such as argon (Ar), neon (Ne), krypton (Kr), xenon (Xe), and mixtures thereof. Other treatment gases for etching a monolayer include hydrochloric acid (HCl), molecular chlorine ($Cl_2$), nitrogen trifluoride ($NF_3$), and molecular hydrogen ($H_2$) as will be described further below.

Figure 2:
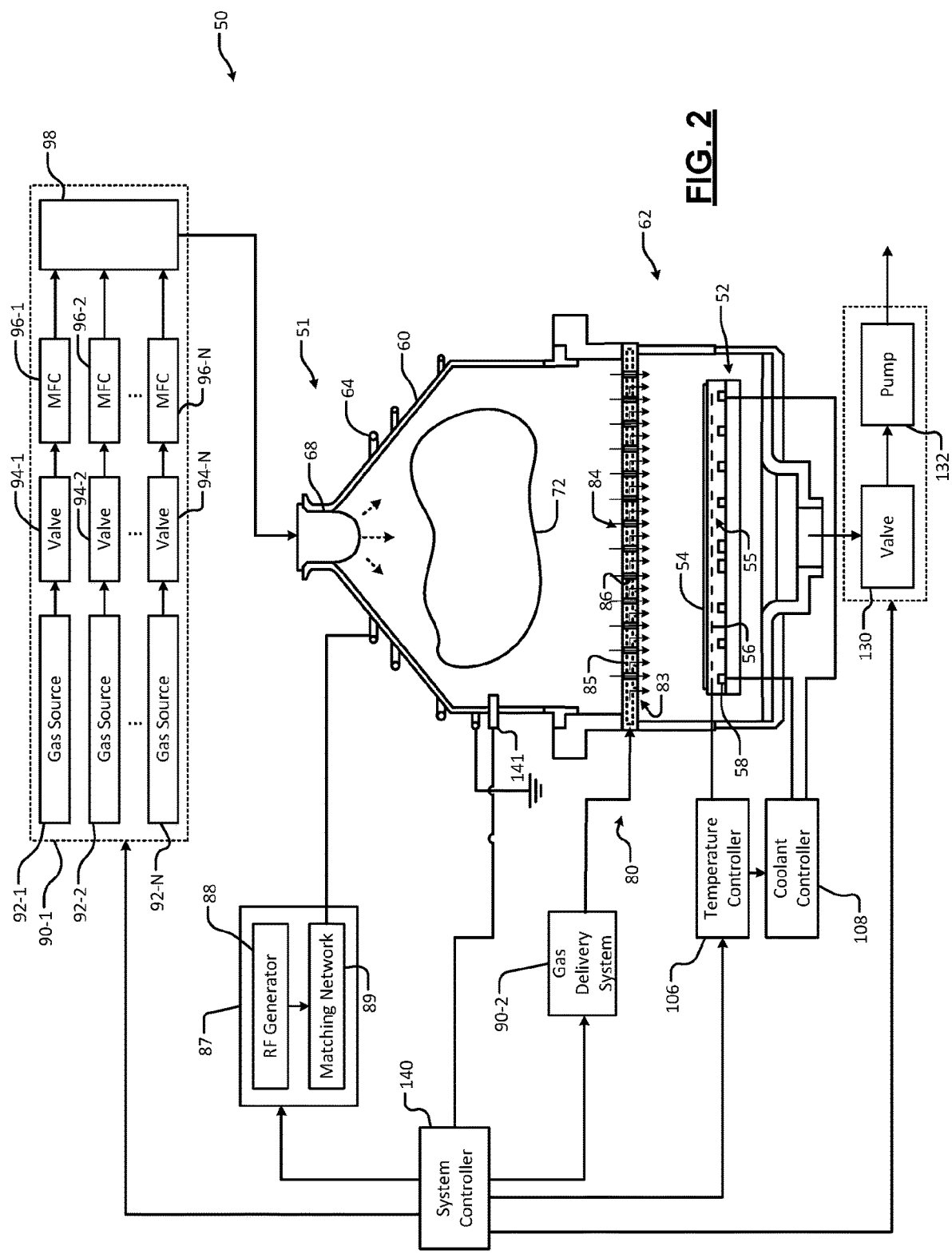
FIG. 2 is a functional block diagram of an example of a substrate processing system according to the present disclosure.

Referring now to FIG. 2, an example substrate processing system 50 for selectively treating a surface of a substrate is shown. The substrate processing system 50 includes a plasma source 51 and a substrate support 52 such as an electrostatic chuck, pedestal or other type of substrate support. In some examples, the plasma source 51 includes an ICP source. As can be appreciated, the plasma source 51 may include other suitable plasma sources such as CCP, ECR or microwave plasma sources.

A substrate 54 is arranged on the substrate support 52 during treatment. In some examples, the substrate support 52 is temperature controlled (heating and/or cooling) using one or more temperature control elements (TCEs) 55, as resistive heaters 56, coolant channels 58, or other types of thermal control devices. The substrate support 52 may include a single temperature control zone or a plurality of temperature control zones that are individually controlled.

In some examples, the substrate processing system 50 includes an upper chamber 60. In some examples, the upper chamber 60 has a dome shape, although other shapes can be used. When ICP plasma is used, a coil 64 is arranged around an outer surface of the upper chamber 60. A gas injector 68 injects plasma gas into the upper chamber 60.

A gas distribution device 84 includes a first plurality of through holes 86 that pass from a top surface of the gas distribution device 84 to a bottom surface of the gas distribution device 84. The gas distribution device 84 also includes a plenum 85 and a second plurality of through holes 83 that pass from the plenum 85 to a bottom surface of the gas distribution device 84. The first plurality of through holes 86 are not in fluid communication with the plenum 85.

If ICP plasma is used, an RF generating system 87 generates and outputs RF power to the coil 64. For example only, the RF generating system 87 may include an RF generator 88 that generates RF power that is fed by a matching network 89 to the coil 64.

A gas delivery system 90-1 includes one or more gas sources 92-1, 92-2, . . . , and 92-N (collectively gas sources 92), where N is an integer greater than zero. The gas sources 92 are connected by valves 94-1, 94-2, . . . , and 94-N (collectively valves 94) and mass flow controllers 96-1, 96-2, . . . , and 96-N (collectively mass flow controllers 96) to a manifold 98. Another gas delivery system 90-2 may be used to deliver treatment gas to the plenum 85 of the gas distribution device 84.

A temperature controller 106 may be connected to the TCEs 55 such as the resistive heaters 56. The temperature controller 106 may communicate with one or more temperature sensors (not shown) that sense a temperature of the substrate support or the substrate and a temperature of a coolant controller 108 to control coolant flow through the coolant channels 58. For example, the coolant controller 108 may include a coolant pump, a reservoir and/or one or more temperature sensors (not shown). A valve 130 and pump 132 may be used to control pressure in the processing chamber and to evacuate reactants therefrom. A system controller 140 may be used to control components of the substrate processing system 10 as shown in FIG. 2.

Systems and methods according to the present disclosure generate plasma utilizing inert gas to generate a high density of metastable radical activated species. The metastable radical activated species carry high enough chemical energy to excite other active radical species that are deposited as a monolayer on a surface of the substrate 54.

In some examples, the process is operated using an ICP chamber with ICP power in a range from 500 W to 5 kW. In some examples, the RF power applied to the inductive coil is at 13.56 MHz, although other frequencies can be used. In some examples, the process is performed at a chamber pressure range of 10 mTorr to 10 Torr.

Figure 3:
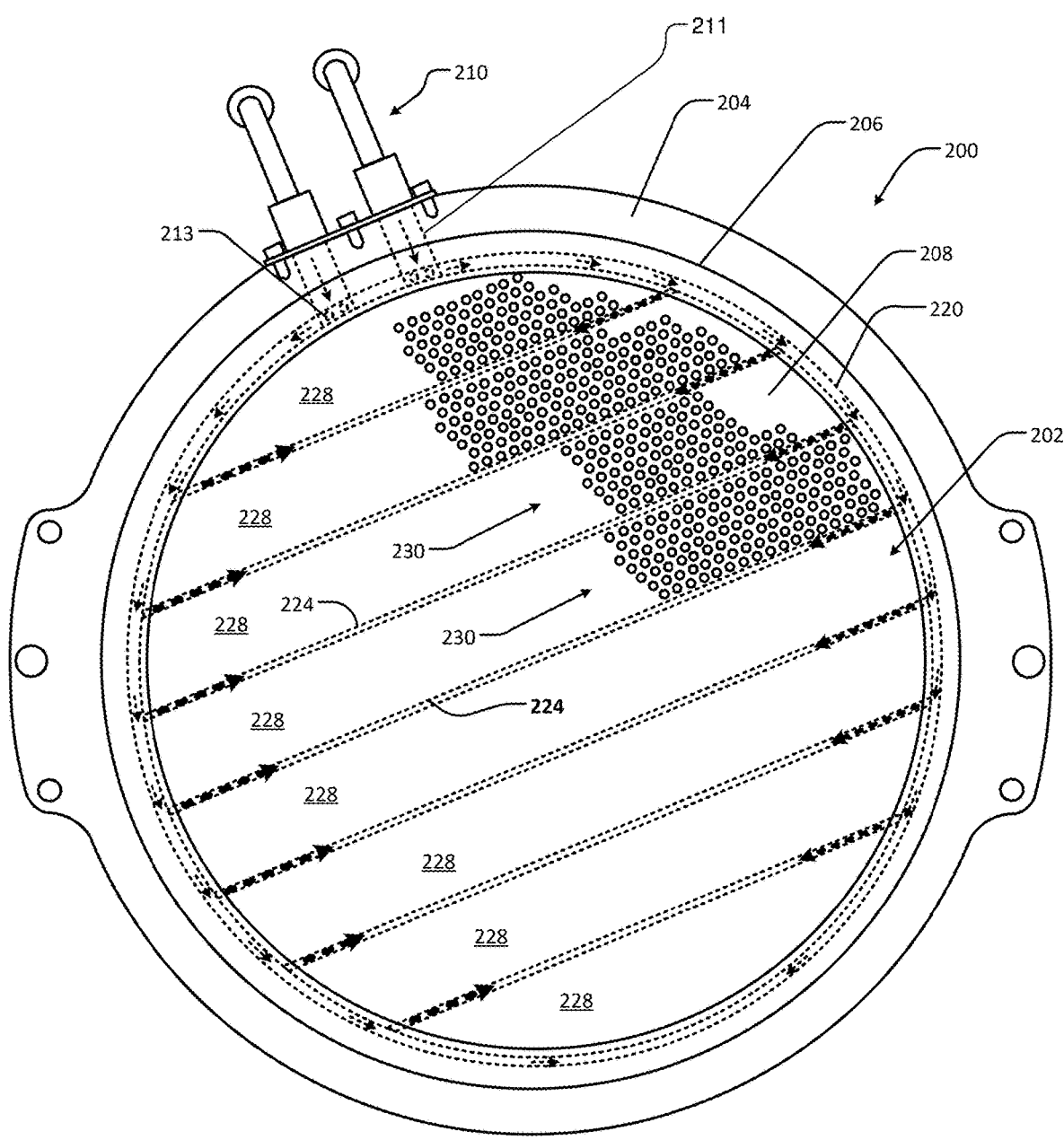
FIG. 3 is a plan view illustrating an example of a gas distribution device including a dual gas plenum according to the present disclosure.

Referring now to FIG. 3, a gas distribution device 200 includes a dual gas plenum 202 for delivering treatment gas species and excited gas species including metastable activated radical species according to the present disclosure. The dual gas plenum 202 delivers a mixture of the treatment gas and metastable activated radical species to the lower chamber without mixing in the upper chamber.

In some examples, the process temperature is in a range from 75° C. to 400° C., although other process temperatures may be used. In other examples, the process temperature is in a range from 100° C. to 200° C., although other process temperatures may be used.

The gas distribution device 200 includes an upper flange 204, sidewalls 206 and a bottom surface 208 (forming an upper surface of the dual gas plenum 202). The dual gas plenum 202 includes a gas inlet 210 for receiving the treatment gas.

The dual gas plenum 202 defines an annular channel 220 and connecting channels 224. The connecting channels 224 extend between opposite sides of the annular channel 220 across inner portions of the bottom surface 208. The annular channel 220 may be formed at a location between the sidewalls 206 and the bottom surface 208. The annular channel 220 and the connecting channels 224 are in fluid communication with the gas inlet 210 via a first channel 211 and a second channel 213. The treatment gas mixture flows through the annular channel 220 and into the connecting channels 224. Downwardly directed though holes shown in FIG. 5 direct the treatment gas mixture from the connecting channels 224 into the lower chamber towards the substrate.

Areas 228 located between the connecting channels 224 include a plurality of through holes 230 that pass through the bottom surface 208. As can be appreciated, only some of the plurality of through holes 230 are shown for purposes of illustration and clarity. In some examples, the plurality of through holes 230 have a circular cross section and uniform spacing, although other cross sections and/or non-uniform spacing can be used. In some examples, the plurality of through holes 232 have a diameter in a range from 3 mm to 10 mm, although other diameters may be used.

Referring now to FIGS. 4-5, cross-sectional views of the bottom surface 208 of the dual gas plenum 202 are shown. In FIG. 4, a first cross-sectional view taken along the connecting channels 224 is shown. Treatment gas is supplied to the annular channel 220, which supplies treatment gas to the connecting channels 224. A plurality of through holes 232 fluidly connects the connecting channels 224 to the lower chamber. In some examples, the plurality of through holes 232 have a diameter in a range from 0.1 mm to 1 mm, although other diameters may be used. The plurality of through holes 232 can be located along the connecting channels 224 with uniform or non-uniform spacing.

In FIG. 5, a second cross-sectional view taken through the area 228 is shown. The plurality of through holes 230 pass through the bottom surface 208 from the upper chamber to the lower chamber. As can be seen, the flow paths of the excited gas species and the treatment gas species are separate until they reach the lower chamber.

Additional examples of gas distribution devices can be found in commonly-assigned U.S. Patent Publication US 20180174870-A1 which is entitled "SYSTEMS AND METHODS FOR METASTABLE ACTIVATED RADICAL SELECTIVE STRIP AND ETCH USING DUAL PLENUM SHOWERHEAD", filed on Dec. 18, 2017, which is hereby incorporated by reference in its entirety. As described therein, the first plurality of through holes can provide an indirect path to prevent a line of sight from the upper chamber to the lower chamber and/or a light blocking structure may be used between the plasma and the gas distribution device if needed for a particular application. In some examples, the purge gas is supplied while the treatment gas is supplied to create positive pressure and prevent the treatment gas from flowing into the upper chamber.

Figure 6:
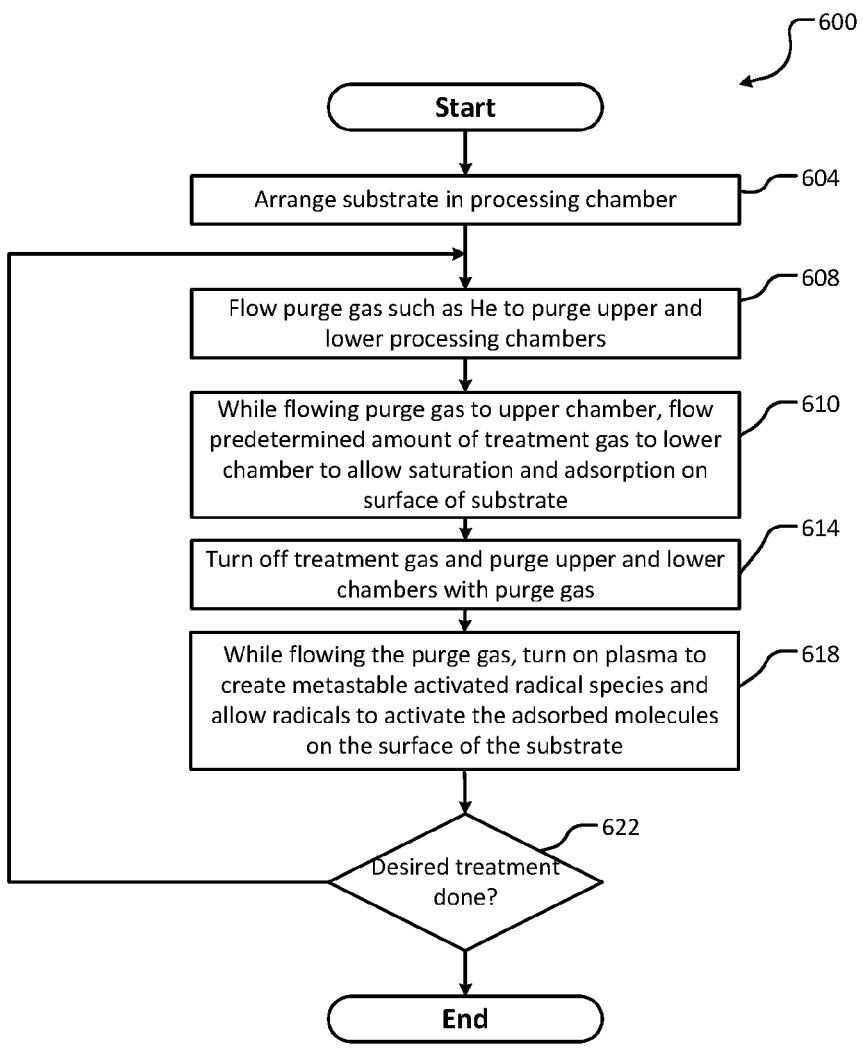
FIG. 6 is a flowchart of an example of a method for atomic layer treatment using metastable activated radical species to surface activate treatment species adsorbed onto an exposed surface of a substrate according to the present disclosure.

Referring now to FIG. 6, a method 600 for treating a substrate is shown. At 604, a substrate is arranged in a processing chamber. At 608, purge gas such as He is supplied to purge the processing chamber for a predetermined period. At 610, after purging, a predetermined amount of treatment gas is supplied to allow saturation and adsorption on the surface of the substrate. In some examples, the treatment gas is selected from molecular oxygen ($O_2$), hydrochloric acid (HCl), molecular chlorine ($Cl_2$), nitrogen trifluoride ($NF_3$), and molecular hydrogen ($H_2$). For example only, 1000 sccm of $O_2$ is supplied for 10 sec to allow $O_2$ saturation and $O_2$ adsorption on a surface of the substrate. Purge gas can be supplied to prevent back diffusion of oxygen into the upper chamber.

After sufficient $O_2$ is supplied, the treatment gas ($O_2$) is turned off at 614 and the processing chamber is purged with high flow He to remove residual $O_2$ in the processing chamber. In some examples, 5000 sccm of He are supplied for 10 sec. At 618, plasma is turned on after the purge. The metastable activated radical species are used to activate the adsorbed $O_2$ on the surface of the substrate and oxidize the surface. At 622, the process can be repeated one or more times to adjust a thickness of the oxidation layer with monolayer control.

In other examples, the systems and methods described herein can be used to etch an exposed surface of a substrate at a monolayer level. For example, the treatment gas may include HCl and the metastable activated radical species are used to surface activate chlorine to etch a monolayer. In other examples, $Cl_2$, $NF_3$ or $H_2$ are adsorbed onto a surface of the substrate at a temperature lower than an etch reaction temperature (e.g. lower than about 300° C. for $Cl_2$ or $NF_3$ and lower than about 400° C. for $H_2$) and then the metastable activated radical species are used to surface activate chlorine, fluorine or hydrogen to provide a controlled etch of a monolayer.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for selectively etching a substrate, comprising:
    a first chamber;
    a second chamber including a substrate support;
    a gas delivery system to selectively supply at least one of a purge gas and a treatment gas to the first chamber and the second chamber;
    a plasma generating system to selectively generate inductively coupled plasma in the first chamber;
    a gas distribution device arranged between the first chamber and the second chamber, the gas distribution device comprising a flange, an annular sidewall, and upper and lower surfaces defining a dual plenum;
    wherein the dual plenum comprises:
        a first plenum defined by a first plurality of through holes extending from the upper surface to the lower surface; and
        a second plenum defined by (i) an annular channel arranged in the annular sidewall, (ii) a plurality of connecting channels extending along parallel chords between opposite sides of the annular channel and connected to the annular channel, and (iii) a second plurality of through holes extending from the plurality of connecting channels through the lower surface, wherein a plurality of rows of the first through holes is arranged between adjacent ones of the plurality of connecting channels; and
    wherein the flange extends radially outwardly from the annular sidewall and comprises an inlet in fluid communication with the annular channel and the plurality of connecting channels via (i) a first channel extending from a radially outer surface of the flange into the flange and (ii) a second channel extending through the annular sidewall and directly connecting to the annular channel; and
    a controller programmed to:
        a) flow the purge gas to purge the first chamber and the second chamber;
        b) after a), flow the treatment gas via the inlet and through the second plenum to create an adsorption layer on a surface of the substrate;
        c) stop flow of the treatment gas;
        d) flow the purge gas to purge the first chamber and the second chamber; and
        e) while flowing the purge gas to the first chamber, strike plasma in the first chamber to create metastable active radical species and to deliver the metastable active radical species to the second chamber through the first plenum to selectively etch the substrate.

2. The substrate processing system of claim 1, wherein the controller is programmed to control the gas delivery system to supply helium (He) as the purge gas and molecular oxygen ($O_2$) as the treatment gas.

3. The substrate processing system of claim 1, wherein the controller is programmed to control the gas delivery system to supply the purge gas selected from a group consisting of helium (He) and molecular nitrogen ($N_2$) and to supply the treatment gas selected from a group consisting of molecular oxygen ($O_2$), hydrochloric acid (HCl), molecular chlorine ($Cl_2$), nitrogen trifluoride ($NF_3$), and molecular hydrogen ($H_2$).

4. The substrate processing system of claim 1, wherein the controller is programmed to etch the substrate by:
controlling the gas delivery system to supply the treatment gas selected from a group consisting of molecular chlorine ($Cl_2$), nitrogen trifluoride ($NF_3$), and molecular hydrogen ($H_2$);
controlling a heater to control a temperature of the substrate during treatment to a predetermined temperature that is less than an etch reaction temperature of the selected treatment gas to form the adsorption layer; and
delivering the metastable active radical species to the second chamber through the gas distribution device to surface activate the adsorption layer to provide monolayer etching.

5. A substrate processing system for selectively etching a substrate, comprising:
a first chamber;
a second chamber including a substrate support comprising a heater;
a gas delivery system to selectively supply at least one of a purge gas and a treatment gas to the first chamber and the second chamber;
a plasma generating system to selectively generate plasma in the first chamber;
a gas distribution device arranged between the first chamber and the second chamber, the gas distribution device comprising a flange, an annular sidewall, and upper and lower surfaces defining a dual plenum;
wherein the dual plenum comprises:
a first plenum defined by a first plurality of through holes extending from the upper surface to the lower surface; and
a second plenum defined by (i) an annular channel arranged in the annular sidewall, (ii) a plurality of connecting channels extending along parallel chords between opposite sides of the annular channel and connected to the annular channel, and (iii) a second plurality of through holes extending from the plurality of connecting channels through the lower surface, wherein a plurality of rows of the first through holes is arranged between adjacent ones of the plurality of connecting channels; and
wherein the flange extends radially outwardly from the annular sidewall and comprises an inlet in fluid communication with the annular channel and the plurality of connecting channels via (i) a first channel extending from a radially outer surface of the flange into the flange and (ii) a second channel extending through the annular sidewall and directly connecting to the annular channel; and
a controller programmed to control the gas delivery system, the plasma generating system, and the heater to:
a) flow the purge gas to purge the first chamber and the second chamber;
b) after a), flow the treatment gas via the inlet and through the second plenum to create an adsorption layer on a surface of the substrate;
c) stop flow of the treatment gas;
d) flow the purge gas to purge the first chamber and the second chamber; and
e) while flowing the purge gas to the first chamber, strike plasma in the first chamber to create metastable active radical species;
f) control a temperature of the substrate during treatment to a predetermined temperature that is less than an etch reaction temperature of the selected treatment gas to form the adsorption layer; and
g) deliver the metastable active radical species to the second chamber through the first plenum to surface activate the adsorption layer to provide monolayer etching.

6. The substrate processing system of claim 1, wherein the controller is programmed to repeat a) to e) one or more times.

7. The substrate processing system of claim 1, wherein the first chamber and the second chamber are void of the treatment gas during e).

8. The substrate processing system of claim 1, wherein the controller is programmed to control the gas delivery system to supply a predetermined volume of the treatment gas during b).

9. The substrate processing system of claim 1, wherein the controller is programmed to control the gas delivery system to supply the purge gas to the first chamber during b).

* * * * *